(12) United States Patent
Ossa

(10) Patent No.: US 6,313,756 B1
(45) Date of Patent: Nov. 6, 2001

(54) METHOD FOR CONTROLLING AN ELECTRIC METER, AND ELECTRIC METER

(75) Inventor: Martin Ossa, Schwabach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/179,649

(22) Filed: Oct. 27, 1998

(30) Foreign Application Priority Data

Oct. 27, 1997 (DE) .............................................. 197 47 391

(51) Int. Cl.⁷ .............................. G08C 19/02; G08C 19/16
(52) U.S. Cl. ................ 340/870.29; 340/870.02; 340/870.19; 340/870.28; 250/551
(58) Field of Search .................. 340/870.28, 870.29, 340/637, 870.2, 870.19; 324/115; 250/221, 222.1, 229, 551

(56) References Cited

U.S. PATENT DOCUMENTS

| 5,136,514 | 8/1992 | Laumann . | |
|---|---|---|---|
| 5,902,998 | * 5/1999 | Olson et al. | 250/221 |
| 6,150,955 | * 11/2000 | Tracy et al. | 340/870.02 |

FOREIGN PATENT DOCUMENTS

0752589A1    1/1997   (EP) .

* cited by examiner

*Primary Examiner*—Timothy Edward, Jr.
(74) *Attorney, Agent, or Firm*—Herbert L. Lerner; Laurence A. Greenberg; Werner H. Stemer

(57) ABSTRACT

A method for controlling an electric meter, on which a module can be mounted. The module cooperates with a basic counting mechanism in the electric meter through a bidirectional optical transmission device. A bidirectional optical transmission path can be varied to detect the type of module that is mounted. An electric meter is provided with optical module detection.

30 Claims, 1 Drawing Sheet

METHOD FOR CONTROLLING AN ELECTRIC METER, AND ELECTRIC METER

BACKGROUND OF THE INVENTION

Field of the Invention

The invention relates to a method for controlling an electric meter on which a module can be mounted, and to an electric meter with a mountable module.

An electric meter is known from Published European Patent Application EP 0 752 589 A1 to have an interior which is subdivided into at least two portions, that are separate from one another. One portion serves to receive components of the measurement mechanism that need to be calibrated, while the other portion serves to hold a display. That separation makes it possible to replace the display if needed, without the necessity of rechecking the calibration of the entire meter.

It is also known that electric meters can be equipped with various accessories, so that the meters can be used in manifold ways. An optical transmission device, for instance, is provided for functional cooperation of the respective accessory with the meter. It is also necessary that the meter be supplied before measurement with the appropriate information as to what type of accessory has been coupled to it, so that it can perform the proper measurement for that accessory.

The method of the prior art is not unproblematic, in the sense that the required information for measurement in conjunction with the accessory must first be input manually into the meter, and incorrect inputs can lead to incorrect measurements.

An electric meter on which a module can be mounted through a bidirectional interface is known from U.S. Pat. No. 5,136,514. There a meter result is read out of the basic counting mechanism into the module.

SUMMARY OF THE INVENTION

It is accordingly an object of the invention to provide a method for controlling an electric meter, and an electric meter, which overcome the hereinafore-mentioned disadvantages of the heretofore-known methods and devices of this general type.

With the foregoing and other objects in view there is provided, in accordance with the invention, a method for controlling an electric meter on which a module can be mounted for cooperating with a basic counting mechanism in the electric meter through a bidirectional optical transmission device having a bidirectional optical transmission path for an optical transmission beam, which comprises influencing or varying the bidirectional optical transmission path for detecting a type of module (accessory) mounted on the meter. This is carried out by at least one of reflecting the optical transmission beam (emitted by the optical transmitter unit of the electric meter) into an optical receiver unit of the electric meter with a 1:1 reflection device disposed in the transmission path, if no module is mounted or only an empty or cover module is mounted; modifying a transmission beam emitted by an optical transmitter unit of the module (modulation in a certain way, turning on/off, etc.), with the transmission beam of the electric meter, through an optical receiver unit of the module, if a passive module without its own processing controller is mounted or coupled to the electric meter; and/or starting a processor (program sequence, etc.) with the transmission beam of th e electric meter through an optical receiver unit of the module for in turn modulating a transmission beam of the module, if an active module with a built-in processor controller is mounted.

The active or "smart" module will accordingly respond intelligently through the optical transmitter unit of the electric meter, once a certain question pulse is present, and send appropriate optical information, with a very specific stated task or a digital identifier or data exchange, back to the base module (the electric meter). The module detection of the electric meter is thus performed in the manner of "sending a telegram".

Automatic module detection is thus advantageously achieved through the use of this method, without having to set the electric meter manually to the particular accessory module connected thereto.

In accordance with another mode of the invention, the transmission beam of the electric meter is modulated in a certain way so that above all if no module is mounted or an empty or cover module is mounted, the meter can distinguish between light from an external source and reflection.

In accordance with a further mode of the invention, the transmission beam of the electric meter may also be pulsed so that the meter can distinguish between light from an external source and reflection.

In accordance with an added mode of the invention, the optical transmitter unit of the passive module outputs a continuous optical signal or a continuous light pulse, so that this signal can be controlled in a simple way, that is it can be interrupted or modulated, by the transmission pulse of the electric meter.

With the objects of the invention in view, there is also provided an electric meter, comprising a basic counting mechanism; a housing at which a module can be mounted; and a bidirectional optical transmission device for coupling the module, the transmission device having an optical transmitter unit, and the transmission device having an optical receiver unit for receiving a transmission beam to be influenced for detecting a type of module mounted at a given time. The transmission device may be associated with a reflection device for reflecting the optical transmission beam of the transmitter unit into the optical receiver unit, if no module, an empty module or a cover module is mounted. The transmission device may be associated with a passive module lacking its own processor controller and having an optical transmitter unit emitting a transmission beam and an optical receiver unit through which the transmission beam of the transmitter unit passes and modifies the transmission beam emitted by the optical transmitter unit of the module (modulation, turning on/off, etc.). The transmission device may be associated with an active module having a built-in processing controller with a processor, an optical transmitter unit emitting a transmission beam and an optical receiver unit through which the transmission beam of the transmitter unit passes and starts the processor (program sequence, etc.), in turn modulating the transmission beam emitted by the optical transmitter unit of the module.

The electric meter for performing the method includes not only a basic counting mechanism but also an output unit, in particular a display device. The various modules can be mounted on or coupled to the housing of the electric meter and cooperate with the basic counting mechanism through the bidirectional optical transmission path.

To that end, a detent device is provided on the electric meter or the modules, to assure an optimal optical transmission path.

In accordance with another feature of the invention, in order to guard against contamination or damage, it is advantageous for the empty or cover module coupled to the electric meter to cover the active or passive module. To that end, the housing of the electric meter may, for instance, include a reception chamber that is formed by the empty module and/or can be closed by the cover module. An active and/or passive module can be placed in the reception chamber.

In accordance with a further feature of the invention, a ripple-control receiver is provided as the active module, which serves to receive and further process ripple-control signals.

In accordance with an added feature of the invention, a predetermined tariff program is stored in memory in each active module, so that various tariff structures can be administered and executed through the electric meter.

In accordance with an additional feature of the invention, various measurement modules that serve to generate maximum values and load profiles are contemplated as the active module or passive module.

In accordance with yet another feature of the invention, an active module with various inputs for controlling the tariffs and synchronizing measured values are connected to the electric meter.

In accordance with a concomitant feature of the invention, relay outputs are provided on the module for transmitting pulses and controlling external devices.

Other features which are considered as characteristic for the invention are set forth in the appended claims.

Although the invention is illustrated and described herein as embodied in a method for controlling an electric meter, and an electric meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
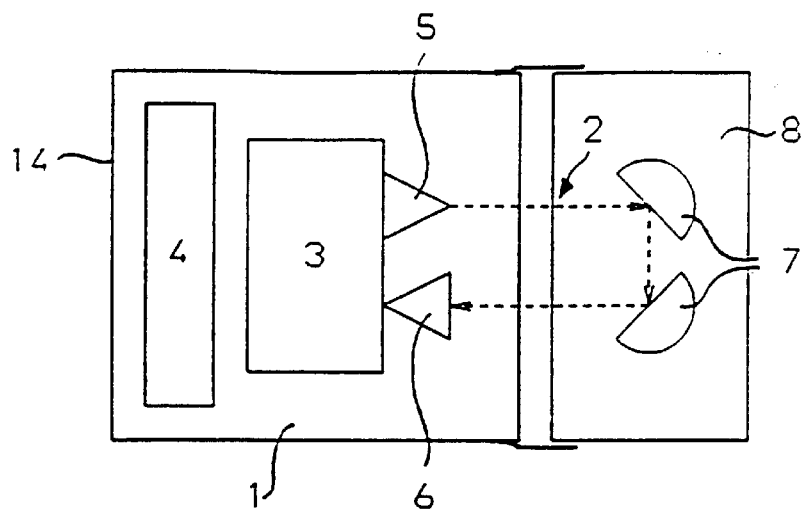
FIG. 1 is a schematic and block diagram of an electric meter with an empty or cover module mounted thereon.
Figure 2:
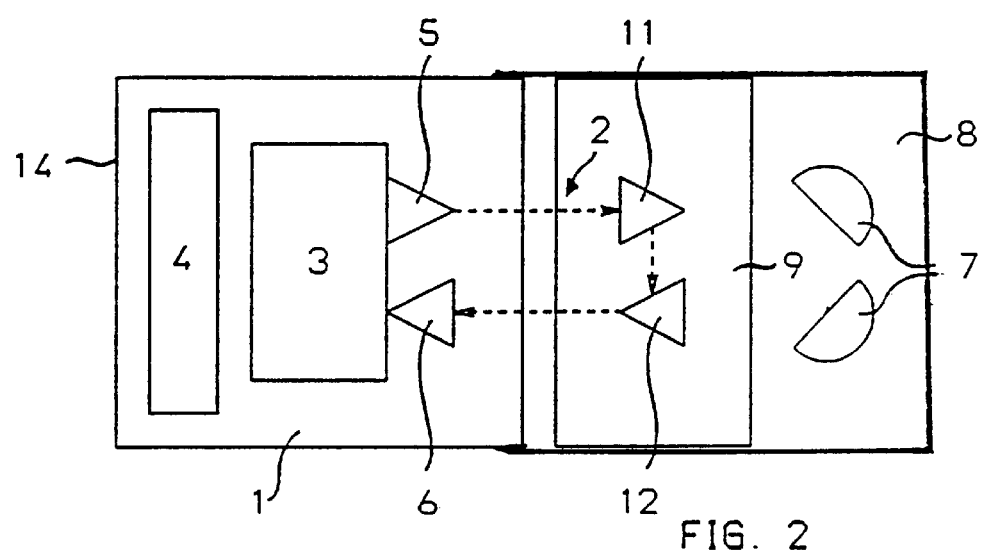
FIG. 2 is a schematic and block diagram of the electric meter with a passive module mounted thereon.
Figure 3:
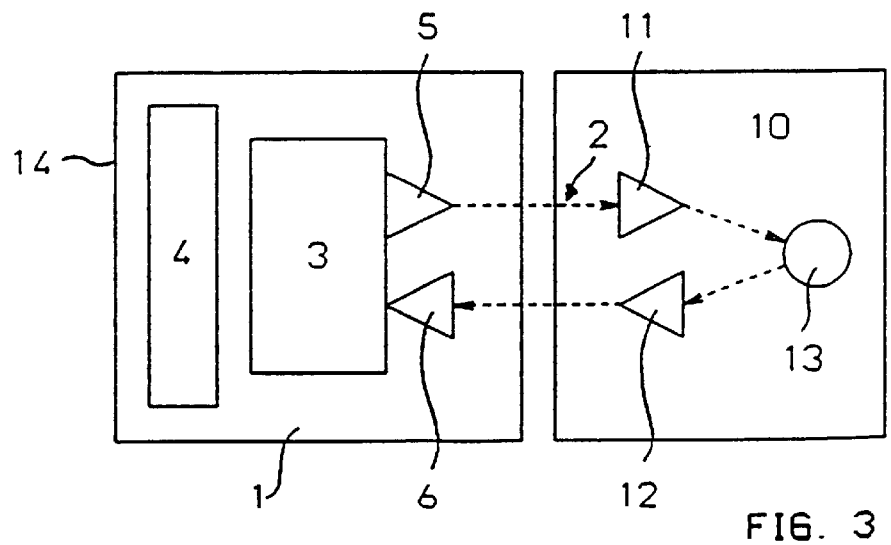
FIG. 3 is a schematic and block diagram of the electric meter with an active module mounted thereon.

Referring now to the figures of the drawings in detail, it is seen that each of the drawing figures is a schematic and block diagram of an electric meter 1, on which a cover module 8 in FIG. 1, a passive module 9 in FIG. 2, or an active module 10 in FIG. 3, can be mounted. The coupled modules cooperate, through a bidirectional optical transmission device 5, 6, with a basic counting mechanism 3 present in the electric meter 1. The electric meter 1 also has a housing 14, which contains the basic counting mechanism 3 as well as a display device 4 and both an optical transmitter unit 5 and an optical receiver unit 6 of the device.

A bidirectional optical transmission path 2 can be varied as described below for automatic detection of the type of module that is mounted.

In the case where the cover module 8 is mounted as in FIG. 1, an optical transmission beam from the optical transmitter unit 5 is reflected, by a 1:1 reflection device 7 disposed in the transmission path 2, into the optical receiver unit 6 of the electric meter. Light from an external source would also be problematic if shading against such light were missing. Therefore, the transmission beam of the electric meter 1 is advantageously modulated or pulsed, so that the meter can distinguish between light from an external source and reflection.

In FIG. 2, the passive module 9 without its own processor controller is mounted on the housing 14 of the electric meter 1. The passive module 9 includes both an optical receiver unit 11 and an optical transmitter unit 12. The passive module 9 interrupts an operative communication of the empty or cover module 8. In the present case this module is constructed in such a way that it covers or surrounds the passive module 9. It may also be constructed as an empty compartment or reception chamber, for instance, and be part of the housing 14. These structures apply logically to the version of FIG. 3, as well, as an alternative.

The transmission beam of the electric meter 1, through the optical receiver unit 11 of the module, modifies a transmission beam emitted by the optical transmitter unit 12 of the module, for instance by modulating it or interrupting it at certain time intervals. The optical transmitter unit 12 of the passive module 9 outputs a continuous optical signal, so that the modification can be carried out constantly and in a simple way.

The active module 10 mounted on the housing 14 of the electric meter 1 in FIG. 3 contains a processor 13, in addition to the transmitter unit 12 and the receiver unit 11. In this case, the transmission beam of the electric meter 1, through the optical receiver unit 11 of the module, starts or activates the processor 13, which immediately starts a program sequence, instruction or the like. This process controller finally modulates the transmission beam of the module, by sending a certain stated object or a digital identifier back to the base module, that is to the electric meter 1.

In order to protect the active or passive module against contamination or damage, a cover module 8 may also be placed over the active module 10 or passive module 9 in the manner of a covering.

The active module 10 may, for instance, include a ripple-control receiver, a tariff control device, a measurement data processor, control inputs, and pulse or relay outputs. A passive module 9 may, for instance, be constructed as a simple tariff control input. What is essential in this case is that the electric meter automatically detects the type of module involved at the time.

I claim:

1. In a method for controlling an electric meter on which a module can be mounted for cooperating with a basic counting mechanism in the electric meter through a bidirectional optical transmission device having a bidirectional optical transmission path for an optical transmission beam, the improvement which comprises:

influencing the bidirectional optical transmission path for detecting a type of module mounted on the meter, and at least one of:

a) reflecting the optical transmission beam into an optical receiver unit of the electric meter with a 1:1 reflection device disposed in the transmission path;

b) modifying a transmission beam emitted by an optical transmitter unit of the module, with the transmission beam of the electric meter, through an optical receiver unit of the module, if a passive module without its own processing controller is mounted; and c) starting a processor with the transmission beam of the electric meter through an optical receiver unit of the module and the processor modulating a transmission beam of the module, if an active module with a built-in processor controller is mounted.

2. The method according to claim 1, which comprises modifying the transmission beam in step b) by modulation.

3. The method according to claim 1, which comprises modifying the transmission beam in step b) by turning the beam on and off.

4. The method according to claim 1, which comprises starting the processor in step c) with a program sequence.

5. The method according to claim 1, which comprises modulating the transmission beam of the electric meter.

6. The method according to claim 1, which comprises pulsing the transmission beam of the electric meter.

7. The method according to claim 1, which comprises outputting a continuous optical signal from the optical transmitter unit of the passive module.

8. The method according to claim 1, which comprises interrupting the transmission beam output by the optical transmitter unit of the module at predetermined time intervals, with the transmission beam of the electric meter, through the optical receiver unit of the module, if the passive module is mounted.

9. An electric meter for mounting a module thereon, the meter comprising:

a basic counting mechanism;

a housing at which a module having a module type can be mounted; and a bidirectional optical transmission device for optically coupling the module, said optical transmission device having an optical transmitter unit, and said optical transmission device having an optical receiver unit for receiving an influenced transmission beam from the module enabling detection of the type of module that is mounted at a given time.

10. The electric meter according to claim 9, wherein said transmission device is associated with a reflection device for reflecting the optical transmission beam of said transmitter unit into said optical receiver unit.

11. The electric meter according to claim 9, wherein said transmission device is associated with a reflection device for reflecting the optical transmission beam of said transmitter unit into said optical receiver unit, and an empty module is mounted.

12. The electric meter according to claim 11, wherein said transmission device is associate with a passive module lacking its own processor controller and having an optical transmitter unit emitting a transmission beam and an optical receiver unit through which the transmission beam of said transmitter unit passes and modifies the transmission beam emitted by the optical transmitter unit of the module, and the passive module is associated with said transmission device and in operative communication with said transmission device.

13. The electric meter according to claim 11, wherein said transmission device is associated with an active module having a built-in processing controller with a processor, an optical transmitter unit emitting a transmission beam and an optical receiver unit through which the transmission beam of said transmitter unit passes and starts the processor, in turn modulating the transmission beam emitted by the optical transmitter unit of the module, and the active module is associated with said transmission device and in operative communication with said transmission device.

14. The electric meter according to claim 11, wherein said transmission device is associated with a passive module lacking its own processor controller and having an optical transmitter unit emitting a transmission beam and an optical receiver unit through which the transmission beam of said transmitter unit passes and modifies the transmission beam emitted by the optical transmitter unit of the module, and the empty module covers the passive module.

15. The electric meter according to claim 11, wherein said transmission device is associated with an active module having a built-in processing controller with a processor, an optical transmitter unit emitting a transmission beam and an optical receiver unit through which the transmission beam of said transmitter unit passes and starts the processor, in turn modulating the transmission beam emitted by the optical transmitter unit of the module, and the empty module covers the active module.

16. The electric meter according to claim 9, wherein said transmission device is associated with a reflection device for reflecting the optical transmission beam of said transmitter unit into said optical receiver unit, and a cover module is mounted.

17. The electric meter according to claim 16, wherein said transmission device is associated with a passive module lacking its own processor controller and having an optical transmitter unit emitting a transmission beam and an optical receiver unit through which the transmission beam of said transmitter unit passes and modifies the transmission beam emitted by the optical transmitter unit of the module, and the passive module is associated with said transmission device and in operative communication with said transmission device.

18. The electric meter according to claim 16, wherein said transmission device is associated with an active module having a built-in processing controller with a processor, an optical transmitter unit emitting a transmission beam and an optical receiver unit through which the transmission beam of said transmitter unit passes and starts the processor, in turn modulating the transmission beam emitted by the optical transmitter unit of the module, and the active module is associated with said transmission device and in operative communication with said transmission device.

19. The electric meter according to claim 16, wherein said transmission device is associated with a passive module lacking its own processor controller and having an optical transmitter unit emitting a transmission beam and an optical receiver unit through which the transmission beam of said transmitter unit passes and modifies the transmission beam emitted by the optical transmitter unit of the module, and the cover module covers the passive module.

20. The electric meter according to claim 16, wherein said transmission device is associated with an active module having a built-in processing controller with a processor, an optical transmitter unit emitting a transmission beam and an optical receiver unit through which the transmission beam of said transmitter unit passes and starts the processor, in turn modulating the transmission beam emitted by the optical transmitter unit of the module, and the cover module covers the active module.

21. The electric meter according to claim 9, wherein said transmission device is associated with a passive module lacking its own processor controller and having an optical transmitter unit emitting a transmission beam and an optical receiver unit through which the transmission beam of said transmitter unit passes and modifies the transmission beam emitted by the optical transmitter unit of the module.

22. The electric meter according to claim 21, wherein the transmission beam emitted by the optical transmitter unit of the module is modified by modulation.

23. The electric meter according to claim 21, wherein the transmission beam emitted by the optical transmitter unit of the module is modified by turning on and off.

24. The electric meter according to claim 21, wherein the passive module includes a measurement module.

25. The electric meter according to claim 21, wherein the passive module includes at least one control input.

26. The electric meter according to claim 9, wherein said transmission device is associated with an active module having a built-in processing controller with a processor, an optical transmitter unit emitting a transmission beam and an optical receiver unit through which the transmission beam of said transmitter unit passes and starts the processor, in turn modulating the transmission beam emitted by the optical transmitter unit of the module.

27. The electric meter according to claim 26, wherein the processor is a program sequence.

28. The electric meter according to claim 26, wherein the active module includes a tariff module with at least one tariff program.

29. The electric meter according to claim 26, wherein the active module includes a measurement module.

30. The electric meter according to claim 26, wherein the active module includes at least one control input.

* * * * *